United States Patent [19]
Toshio et al.

[11] Patent Number: 5,227,664
[45] Date of Patent: * Jul. 13, 1993

[54] SEMICONDUCTOR DEVICE HAVING PARTICULAR MOUNTING ARRANGEMENT

[75] Inventors: Sugano Toshio, Kokubunji; Tsukui Seiichirou, Komoro; Suzuki Shigeru, Kokubunji, all of Japan

[73] Assignees: Hitachi, Ltd., Tokyo; Hitachi Tobu Semiconductor, Saitama, both of Japan

[*] Notice: The portion of the term of this patent subsequent to Jan. 8, 2008 has been disclaimed.

[21] Appl. No.: 710,642

[22] Filed: Jun. 5, 1991

Related U.S. Application Data

[60] Division of Ser. No. 606,292, Oct. 31, 1990, Pat. No. 5,103,247, which is a continuation of Ser. No. 310,563, Feb. 15, 1989, Pat. No. 4,984,064.

Foreign Application Priority Data

Feb. 26, 1988 [JP] Japan .................................. 63-42071

[51] Int. Cl.$^5$ ...................... H01L 23/12; H01L 25/12
[52] U.S. Cl. .................................. 257/723; 257/724; 257/685; 257/686
[58] Field of Search ................ 357/80, 75, 68; 361/400, 412, 413, 393, 395; 257/723, 724, 685, 686

[56] References Cited

U.S. PATENT DOCUMENTS

| | | | |
|---|---|---|---|
| 4,074,342 | 2/1978 | Honn et al. | 357/75 |
| 4,616,655 | 10/1986 | Weinberg et al. | 357/80 |
| 4,982,265 | 1/1991 | Watanabe et al. | 357/75 |
| 4,984,064 | 1/1991 | Toshio et al. | 357/75 |
| 4,994,896 | 2/1991 | Uemura et al. | 357/75 |
| 5,061,990 | 10/1991 | Arakawa et al. | 357/75 |

OTHER PUBLICATIONS

"VLSI Device Handbook", published by K. K. Science Forum, Nov. 28, 1983, pp. 239–250.

Primary Examiner—Rolf Hille
Assistant Examiner—S. V. Clark
Attorney, Agent, or Firm—Pennie & Edmonds

[57] ABSTRACT

In an SIP type module of the type wherein memory ICs are mounted to both surfaces of a substrate, the present invention provides a face package type memory module wherein packaging is made in an inclined direction in place of vertical packaging of the prior art technique and only the memory ICs mounted to the upper surface side of the substrate are deviated to the positions closer to the end portion of the substrate in order to drastically reduce the packaging height.

9 Claims, 7 Drawing Sheets

FIG. 3

PINOUT

| PIN NO. | PIN NAME | PIN NO. | PIN NAME |
|---|---|---|---|
| 1 | Vss | 37 | DQ33 |
| 2 | DQ0 | 38 | DQ35 |
| 3 | DQ16 | 39 | Vss |
| 4 | DQ1 | 40 | CAS0 |
| 5 | DQ17 | 41 | NC |
| 6 | DQ2 | 42 | NC |
| 7 | DQ18 | 43 | CAS1 |
| 8 | CQ3 | 44 | RAS0 |
| 9 | DQ19 | 45 | RAS1 |
| 10 | VDD | 46 | DQ37 |
| 11 | NC | 47 | WE |
| 12 | A0 | 48 | GND |
| 13 | A1 | 49 | DQ8 |
| 14 | A2 | 50 | DQ24 |
| 15 | A3 | 51 | DQ9 |
| 16 | A4 | 52 | DQ25 |
| 17 | A5 | 53 | DQ10 |
| 18 | A6 | 54 | DQ26 |
| 19 | OE | 55 | DQ11 |
| 20 | DQ4 | 56 | DQ27 |
| 21 | DQ20 | 57 | DQ12 |
| 22 | DQ5 | 58 | DQ28 |
| 23 | DQ21 | 59 | VDD |
| 24 | DQ6 | 60 | DQ29 |
| 25 | DQ22 | 61 | DQ13 |
| 26 | DQ7 | 62 | DQ30 |
| 27 | DQ23 | 63 | DQ14 |
| 28 | A7 | 64 | DQ31 |
| 29 | DQ36 | 65 | DQ15 |
| 30 | VDD | 66 | DQ38 |
| 31 | A8 | 67 | NC |
| 32 | NC | 68 | GND |
| 33 | NC | 69 | NC |
| 34 | NC | 70 | GND |
| 35 | DQ34 | 71 | DQ39 |
| 36 | DQ32 | 72 | Vss |

SEMICONDUCTOR DEVICE HAVING PARTICULAR MOUNTING ARRANGEMENT

This application is a divisional of Ser. No. 07/606,292 filed Oct. 31, 1990, now U.S. Pat. No. 5,103,247, which is a continuation of Ser. No. 07/310,563, filed Feb. 15, 1989, now U.S. Pat. No. 4,984,064.

BACKGROUND OF THE INVENTION

This invention relates to an effective technique for packaging a high density module used, for example in an electronic computer system.

To improve packaging density of electronic devices such as semiconductor devices, it is a recent trend to use a module of an SIP (Single In-Line Package) structure. The SIP structure includes a substrate for mounting electronic devices, formed by a multi-layered substrate fabrication technique, with semiconductor parts mounted to both surfaces of this substrate and external electrodes disposed along one of the edges of the substrate.

The multi-layered substrate fabrication technique is disclosed, for example, in "VLSI Device Handbook", published by K. K. Science Forum, Nov. 28, 1983, pp. 239–250.

In semiconductor devices of the SIP structure wherein a plurality of face-package type semiconductor parts are mounted to both surfaces of a substrate such as a memory module consisting of DRAM, for example, it has been customary to mount them to a mother board or a socket in a vertical direction.

SUMMARY OF THE INVENTION

The inventor of the present invention examined the following technique as a packaging technique in a semiconductor device constituting a module of the SIP structure described above.

When the semiconductor device of the SIP structure is packaged in a vertical direction, a space must be secured on a mother board as a mounting substrate in consideration of the length of a module substrate in the transverse direction, the length of a socket, and the like. Particularly because higher integration density and miniaturization are increasing requirements for a computer system and a microcomputer, a strict limitation is imposed to the packaging height of the semiconductor device and this becomes a critical problem. When DIP (Dual In-Line Package), face-package type package (e.g. FPP) and the module of the SIP structure described above are packaged into one system, the spaces above DIP and FPP will become waste spaces because the SIP structure module is higher than the other packages.

To reduce the packaging height of the semiconductor device, it will be possible to employ a technique which packages the semiconductor device slantingly to the mother board. However, with higher integration density and higher functions of semiconductor parts mounted to the substrate, their external structure or package size tends to become greater. If such a large semiconductor device substrate is packaged slantingly onto the mother board, the corners of the package will come into contact with the mother board or an encapsulation member so that slant packaging becomes difficult to attain and the limitation to the height of the packaging space cannot be substantially mitigated in most cases.

When mounted to both surfaces of the substrate, the semiconductor devices are mounted to the extreme end portion of the substrate on the side where the external electrodes are not formed. Therefore, the semiconductor parts are situated at the positions higher than the side end portion of the substrate. Then, when the mother boards are mounted into the system or in many stages, adverse influences of defects, etc. will develop in the semiconductor devices due to contact with others (e.g. mother boards). In other words, when the conventional double face package type SIP structure module is slantingly packaged, a sufficient packaging space must be secured on the module and the problem of the vertical packaging cannot be solved substantially.

When the mother boards each having the semiconductor device described above mounted thereto are packaged in multiple stages, projecting external electrodes such as socket pins from the lower surface of an upper mother board come into contact with the leads (external leads) of the semiconductor devices situated therebelow and cause short-circuit. To prevent this contact defect, the electrode portions projecting from the back of the substrate must be subjected to insulation treatment.

With the problems of the prior art technique described above, the present invention is directed to provide a technique which makes it possible to attain slant packaging at an angle corresponding to the limit of the height of the packaging space.

It is therefore a first object of the present invention to provide a high density packaging technique having high reliability.

It is another object of the present invention to provide a high density device suitable for a large capacity memory.

It is still another object of the present invention to provide a technique capable of packaging compactly a large number of memory modules.

The above and other objects and novel features of the present invention will become more apparent from the following description when taken in conjunction with the accompanying drawings.

Among the inventions disclosed therein, the following will demonstrate a typical invention.

The semiconductor device of the present invention is characterized in that when semiconductor parts are mounted to both surfaces of a substrate, the semiconductor parts on one of the surfaces are mounted at positions spaced apart more greatly from external electrodes at one side edge surface of the substrate than the semiconductor parts mounted onto the other surface of the substrate.

In other words, when the substrate of the module described above is mounted slantingly to the mother board, the semiconductor parts on the lower side (that is, those mounted on the side facing the mother board) are mounted to the extreme end portion of the substrate on the side where the external electrode terminals are not formed, whereas the semiconductor parts mounted on the upper side of the substrate are mounted at positions close to the external electrode terminals.

The semiconductor device consisting of these semiconductor parts that are mounted to both surfaces of the substrate is mainly incorporated in a large scale apparatus such as a general purpose computer, a work station, and the like, and constitutes a large capacity memory. Since the size of these apparatuses is limited, the semiconductor device must be made compact as much as possible. According to the present invention described above, there can be obtained the following novel effects while satisfying the requirement described above.

First of all, according to the means described above, the semiconductor parts mounted to one of the surfaces of the substrate is spaced apart more greatly from the external electrodes than the semiconductor parts mounted to the other surface so that slant packaging with a deeper angle can be accomplished while this surface faces the packaging surface of the mother board. Accordingly, slant packaging having a sufficient angle can be attained even in a packaging space having a limited height and a spatial packaging density of an electronic device such as a semiconductor device by a double face packaging memory module can be improved.

When the double face packaging type SIP memory module is packaged in the same space as DIP type ICs and FPP type ICs, the wasteful packaging space can be reduced because the SIP type module can be packaged sufficiently lowly and an electronic device having a reduced size can be accomplished.

The semiconductor parts mounted on the upper surface of the substrate face the mother board and are thus prevented from coming into contact with other parts.

Furthermore, when the mother boards each having the semiconductor device mounted thereto are packaged in multiple stages, the external electrodes projecting from the lower surface of an upper mother board such as the socket pins do not easily come into contact with the leads of the semiconductor parts therebelow. In other words, since there is no need to make insulation treatment on the back of the mother board, the number of man-hours can be reduced.

BRIEF DESCRIPTION OF THE DRAWINGS

FIG. 3 is a pin arrangement table of external electrode terminals of the wiring substrate;

DESCRIPTION OF THE PREFERRED EMBODIMENTS

Figure 1:
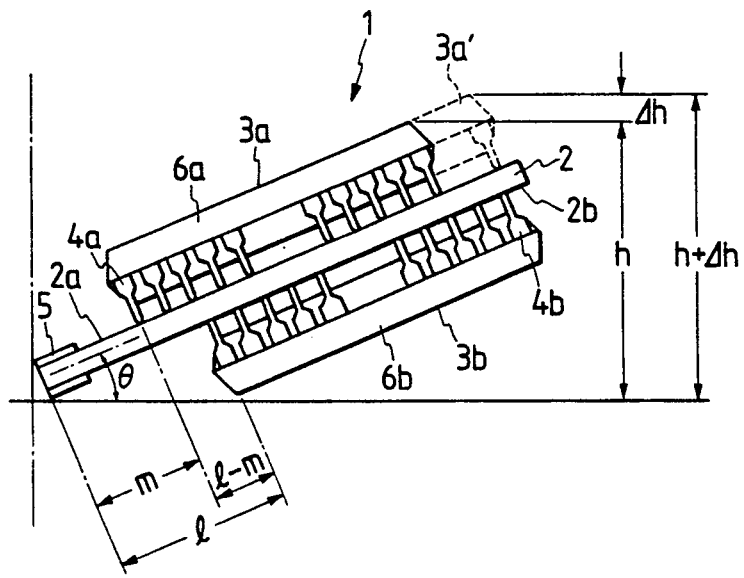
FIG. 1 is a sectional view showing the state where a semiconductor device of the present invention is packaged slantingly.

Hereinafter, preferred embodiments of the present invention will be described definitely with reference to the accompanying drawings. Incidentally, like reference numerals are used throughout the drawings to identify those constituents which have the same function and repetition of explanation of such constituents will be omitted.

EMBODIMENT 1

The semiconductor device 1 shown in FIG. 1 has a structure wherein a plurality of semiconductor parts 3a, 3b of an SOJ (Small Outline J-lead package) type are mounted to both main surfaces 2a, 2b of a printed wiring substrate 2 having a multi-layered wiring structure, and is mainly used as a memory module of an electronic computer, or the like.

As shown in FIG. 1, the semiconductor parts 3a mounted to the upper surface 2a of the 2 are mounted at a position closer to the external electrode terminals 5 than the semiconductor parts 3b mounted to the lower surface 2b. In the case of a conventional double face package module, the semiconductor parts 3a are mounted at the position represented by dotted line in FIG. 1. The semiconductor device 1 of the present invention is mounted at the position deviated by a distance l-m in FIG. 1 from the position of the conventional semiconductor part.

The semiconductor device 1 having the structure described above can be obtained in the manner described below, for example.

The semiconductor parts 3a, 3b are mounted to both surfaces 2a, 2b of the substrate 2. The semiconductor parts 3a, 3b are the SOJ type packages which incorporate a semiconductor pellet functioning as a memory and have J-shaped leads 4a, 4b projecting from their two sides and face other in the opposite direction.

Figure 5A:
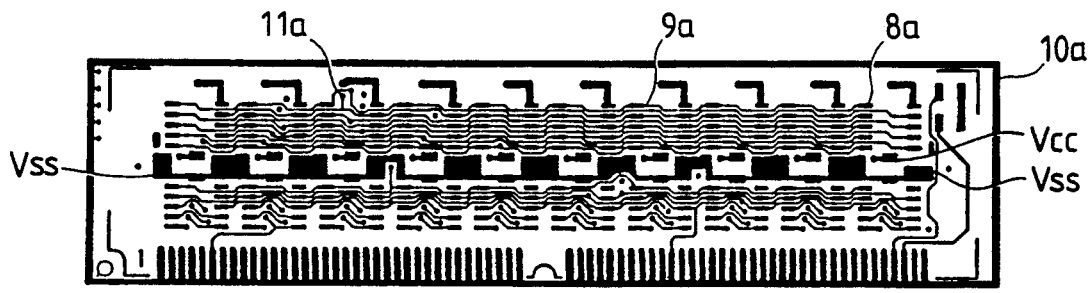
FIGS. 5(a)–5(d) are plan views showing the pattern of each layer of a four-layered wiring substrate for mounting the semiconductor parts described above.
Figure 5B:
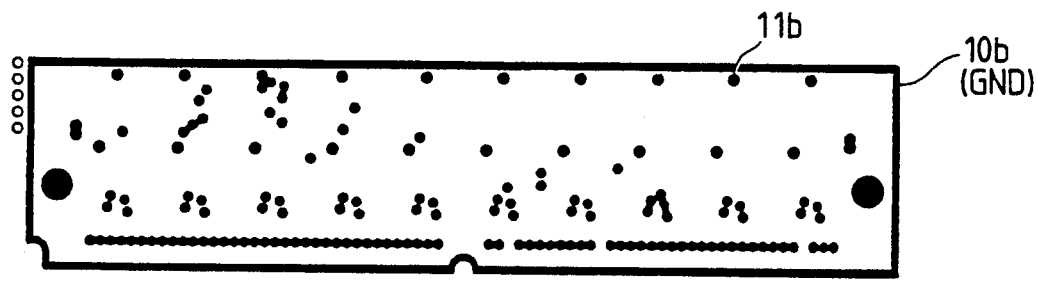
Figure 5C:
Figure 5D:
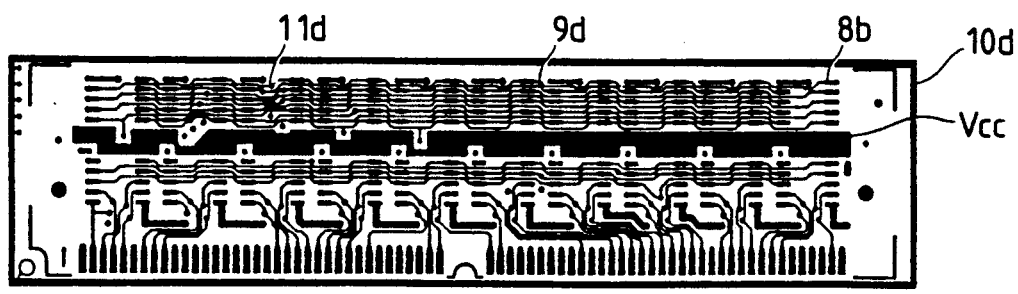

These semiconductor parts 3a, 3b are mounted to the substrate 2 by fixing the J-shaped projecting leads 4a, 4b to corresponding electrode pads 8a, 8b on the substrate 2 shown in FIGS. 5(a) and 5(d) by soldering or the like.

In accordance with this embodiment, however, the mounting positions of the semiconductor parts 3a, 3b onto the substrate 2 are such that the mounting position of the semiconductor parts 3a on one of the surfaces (2a) of the substrate 2 is deviated from the mounting position of the semiconductor parts 3b on the other surface 2b. In other words, whereas the mounting position of the semiconductor parts 3b on the lower surface 2b of the substrate 2 is spaced apart by the distance l (at least 7.23 mm) from the tip of the external electrode terminal 5, the mounting position of the semiconductor parts 3a on the upper surface 2a of the substrate 2 is spaced apart by the distance m (3.17 mm<m<l) from the tip of the external electrode terminals 5 of the substrate 2.

In this embodiment the semiconductor device 1 is mounted while being inclined at a predetermined angle $\theta(\theta<90°)$ to the board surface of a sub-mother board 16 but the semiconductor parts 3b mounted to the opposed surface 2b of the substrate 2 facing the board surface of this sub-mother board 16 have the distance l (at least 7.23 mm) from the external electrode terminals 5 of the substrate 2 and this distance l is greater than the mounting distance m (3.17 mm<m<l) of the parts 3a on the other surface 2a (that is, l>m).

As described above, the packaging height can be reduced by $\Delta h$ as shown in the drawing by mounting the semiconductor parts 3a to be mounted on the upper surface 2a of the substrate 2 at the position deviated by the distance l-m from the side edge of the substrate 2 on the side of the external electrode terminals 5. The packaging height in this embodiment is h.

Figure 2A:
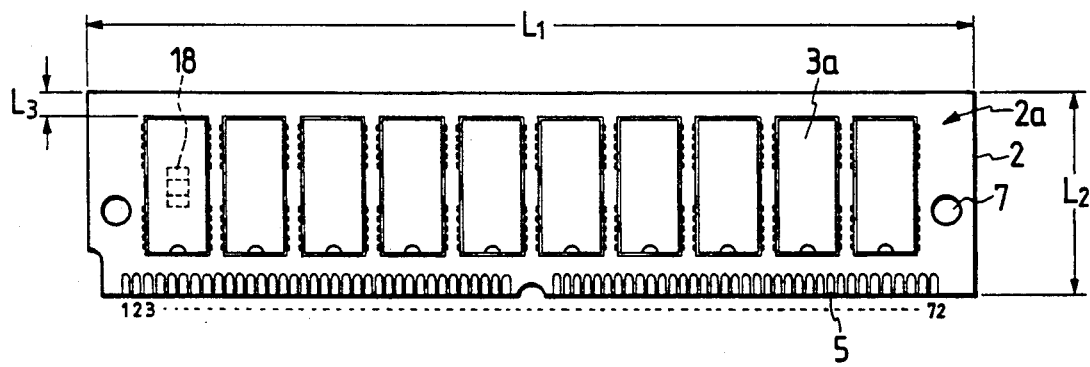
FIG. 2(a) is a top view when a semiconductor device is mounted to the upper surface of a wiring substrate.
Figure 2B:
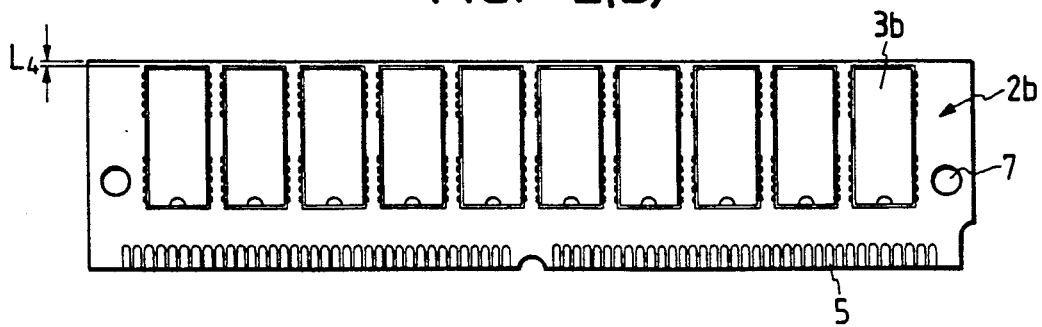
FIG. 2(b) is a bottom view when the semiconductor device is mounted to the lower surface of the wiring substrate.

FIG. 2(a) is a top view of the semiconductor device 1 described above from the upper surface 2a side and FIG. 2(b) is a bottom view from the lower surface 2b side.

In these drawings, the semiconductor parts 3a, 3b are mounted to the upper and lower surfaces 2a, 2b of the substrate 2 and a face-package capacitor 18 is mounted by soldering at the center below the semiconductor parts. Through holes 7 for locating are bored on the substrate 2. Here, numeric values are $L_1 = 107.95$ mm, $L_2 = L_3 = 3.0$ mm and $L_4 = 0.3 \sim 0.5$ mm, for FIG. 3 is a pin arrangement table showing the function of the external electrode terminals 5 shown in FIG. 2(a). RAS (Row Address Strobe) selects word lines and CAS (Column Address Strobe) selects column decoders. Symbols A0 to A8 represent address input pins; We is a write enable pin; DQ is a data input/output pin; and $V_{ss}$ and VDD ($V_{cc}$) are power source terminals in the broad sense. Particularly, VDD ($V_{cc}$) is referred to as a power source voltage terminal and $V_{ss}$, a reference voltage terminal.

Figure 4:
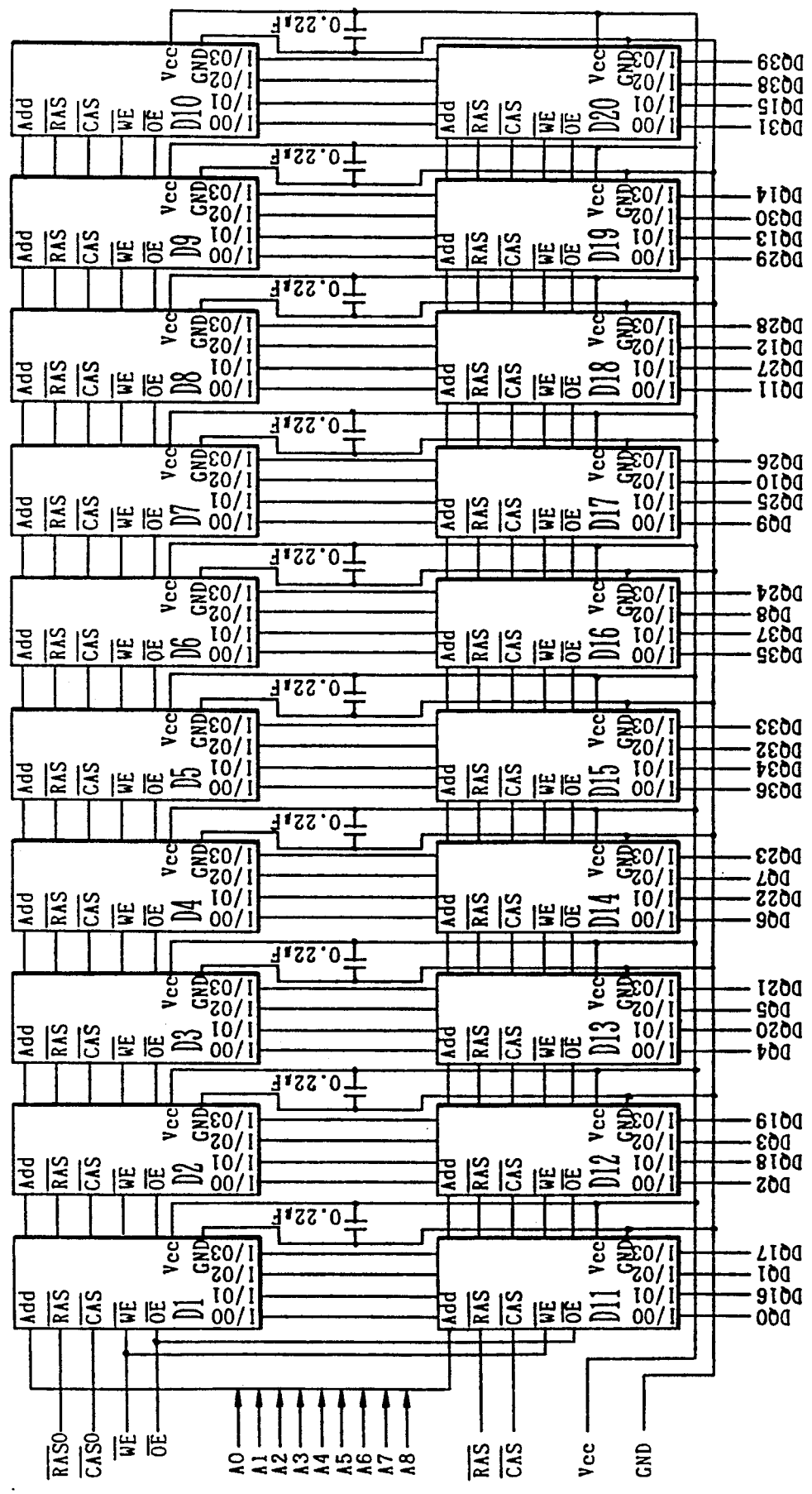
FIG. 4 is a block diagram showing the circuit functions of the semiconductor device.

FIG. 4 is a circuit diagram showing definitely the semiconductor device in accordance with the present invention. Symbols D1 to D20 represent the SOJ type memory ICs shown in FIG. 2. Though this embodiment represents a block diagram of a memory module of 512K × 40 bits by way of example, the present invention is not particularly limited thereto. It is possible to mount sixteen 256K memory ICs in total to both surfaces (512K × 32 bits) or to mount sixteen or twenty ICs having a 1M capacity by laminating 256K memory ICs in four stages.

Next, the fabrication method of the substrate 2 used in this embodiment will be explained with reference to FIGS. 5(a) to 5(d).

First of all, a copper foil is deposited to the main plane of a glass-epoxy resin sheet forming the first layer 10a of the substrate 2 shown in FIG. 5(a) and is then etched in a desired shape to form a desired wiring 9a. Next, through-holes 11a are bored by a drill at predetermined positions of the epoxy resin sheet and a solder or the like is deposited to the inner wall of each through-hole 11a to form a through-hole wiring. There is thus completed the upper surface 2a.

FIG. 5(b) shows the second layer 10b of the substrate 2. It is used mainly as a ground wiring layer (GND) and is formed through the same process as that of the first layer.

FIG. 5(c) shows the third layer 10c of the substrate 2. It is used mainly as VDD (power source) and is formed through the same process as described above.

FIG. 5(d) shows the fourth layer 10d of the substrate 2. It constitutes the lower surface 2b and is formed through the same process as described above.

A plurality of glass epoxy resin sheets subjected to the working treatment described above are laminated through an adhesive to obtain the substrate 2.

Figure 9:
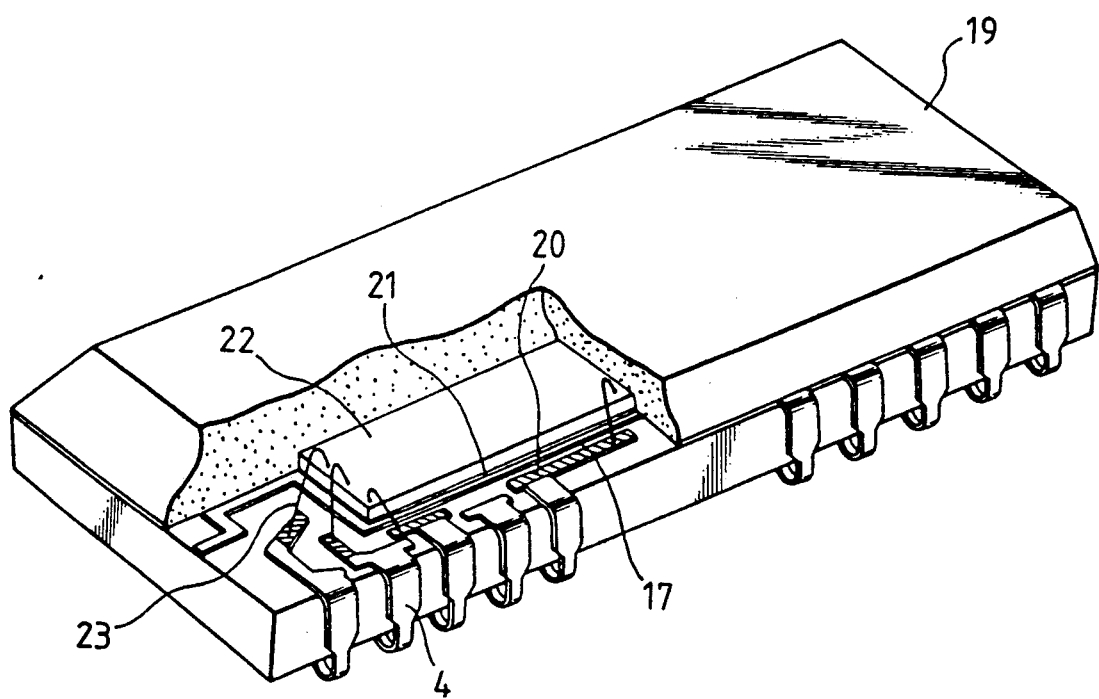
FIG. 9 is a perspective view of the semiconductor part to be mounted to the substrate.

Next, the resin-encapsulated memory ICs to be mounted to the substrate will be explained. FIG. 9 is a perspective view of an SOJ type DRAM (Dynamic Random Access Memory) of the semiconductor parts 3a, 3b shown in FIG. 1. In FIG. 9, reference numeral 19 represents a resin encapsulation member which is transfer-molded in a molding die. This resin encapsulation member is made of an epoxy resin, for example. A semiconductor pellet 22 equipped with a circuit and external terminals on its main plane and made of an Si single crystal, tab portions 17 for supporting the pellet through an electrically conductive adhesive material 21 such as an Ag paste and thin metallic wires 23, e.g. Au wires, for connecting electrically the external terminal to the lead 4 are encapsulated in the resin encapsulation member 19. Reference numeral 20 represents a silver spot plating which is formed at the bonding portion on the inner lead portion to be encapsulated inside the resin of the lead 4.

Besides the SOJ type package, this embodiment can be applied to packaging of face package type packages such as PLCC (Plastic Leaded Chip Carrier), module ICs having a large number of laminated semiconductor pellets, FPP (Flat Package Plastic), LCC (Leadless Chip Carrier), and so forth.

Figure 6:
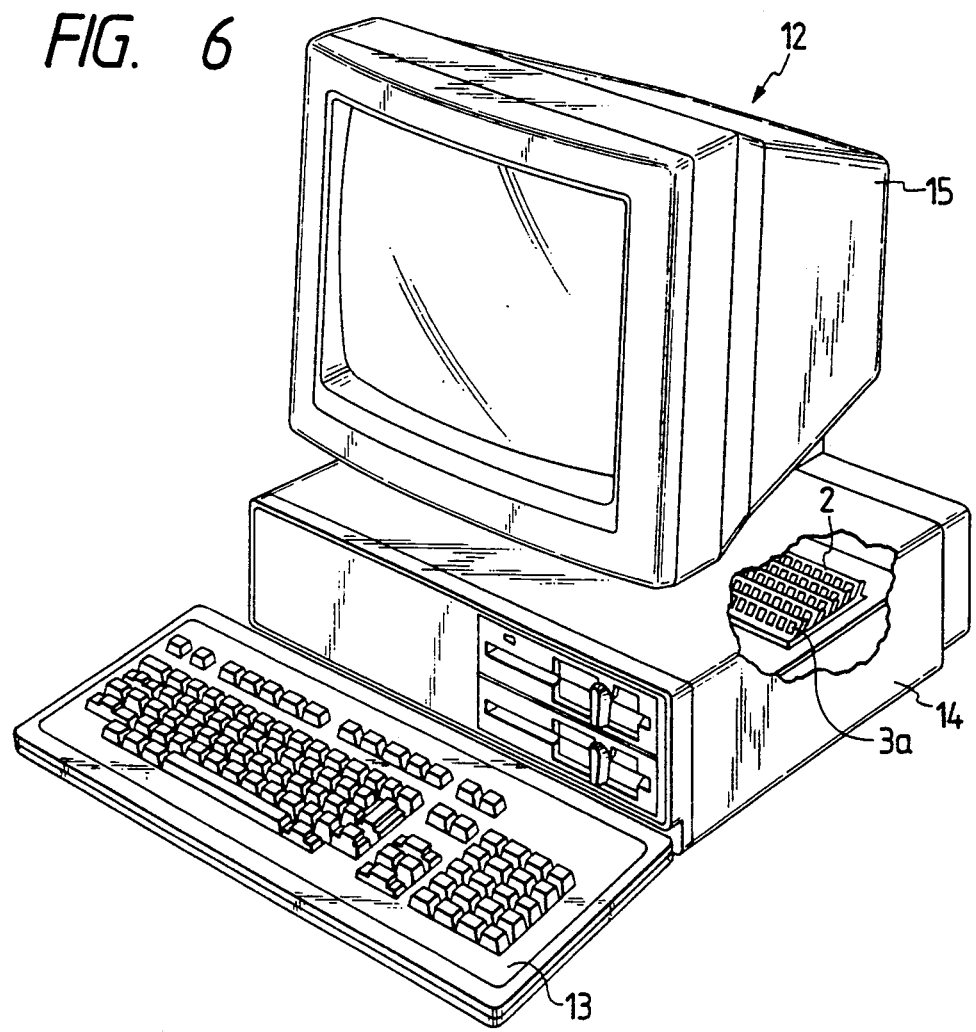
FIG. 6 is a perspective view of a system which incorporates semiconductor modules.

FIG. 6 is a perspective view when the semiconductor device shown in FIG. 1 is practically applied to a personal computer 12.

The personal computer main body 12 consists of a keyboard 13 for inputting instructions of functions and characters, a system unit 14 for conducting document processing and making overall control of the computer system as a whole, and a display unit 15 for displaying the inputted characters and messages. The semiconductor device 1 of this embodiment is incorporated in the system unit 14 described above.

Figure 7:
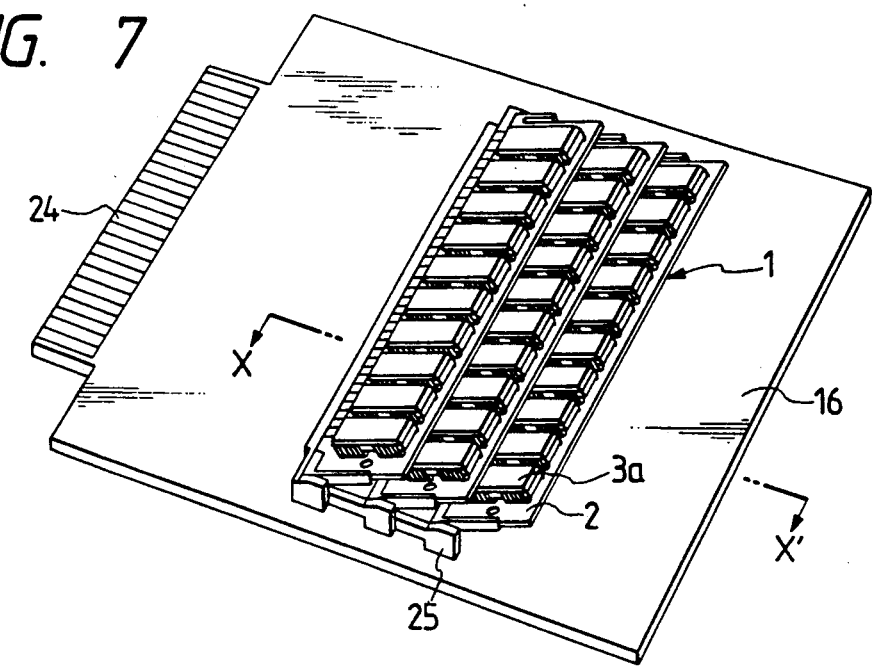
FIG. 7 is a perspective view of a system incorporating a semiconductor module plate.

FIG. 7 is an enlarged view of the semiconductor device which is incorporated in the system unit 14 shown in FIG. 6 and is mounted to the sub-mother board 16.

The semiconductor device 1 is fitted to a plastic socket 25. This socket 25 is in turn mounted to the sub-mother board 16 which is equipped with a predetermined copper wiring pattern on its surface and consists of the glass-epoxy resin sheet. The signal from the semiconductor device 1 is picked up from a connector terminal portion 24 through the socket 25 and the wiring pattern. Furthermore, this connector terminal portion 24 is connected to a terminal connection means of the mother board, not shown, inside the system unit.

Figure 8A:
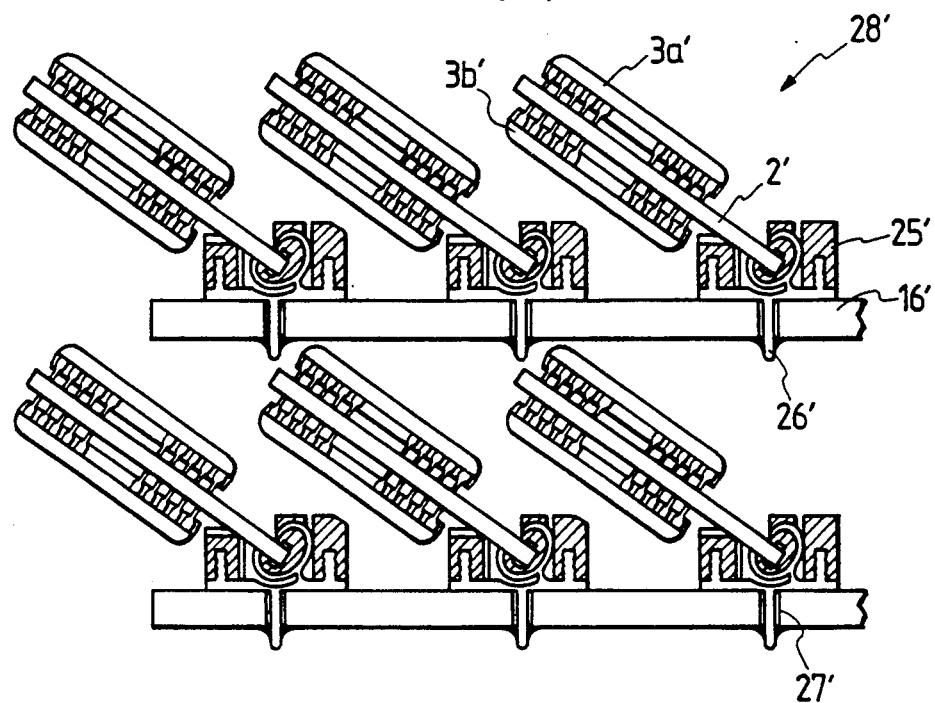
FIG. 8(a) is a sectional view of principal portions when conventional double face packaging modules are packaged in multiple stages.

In FIG. 8(a), the semiconductor parts 3a', 3b' are mounted on both surfaces of the substrate 2' at the positions opposing one another on the side of the substrate where it is not fitted to the socket 25'. The socket pin 26' of the socket 25' is fitted into the through-hole 27' formed on the sub-mother board 16' to form the memory module 28'.

Figure 8B:
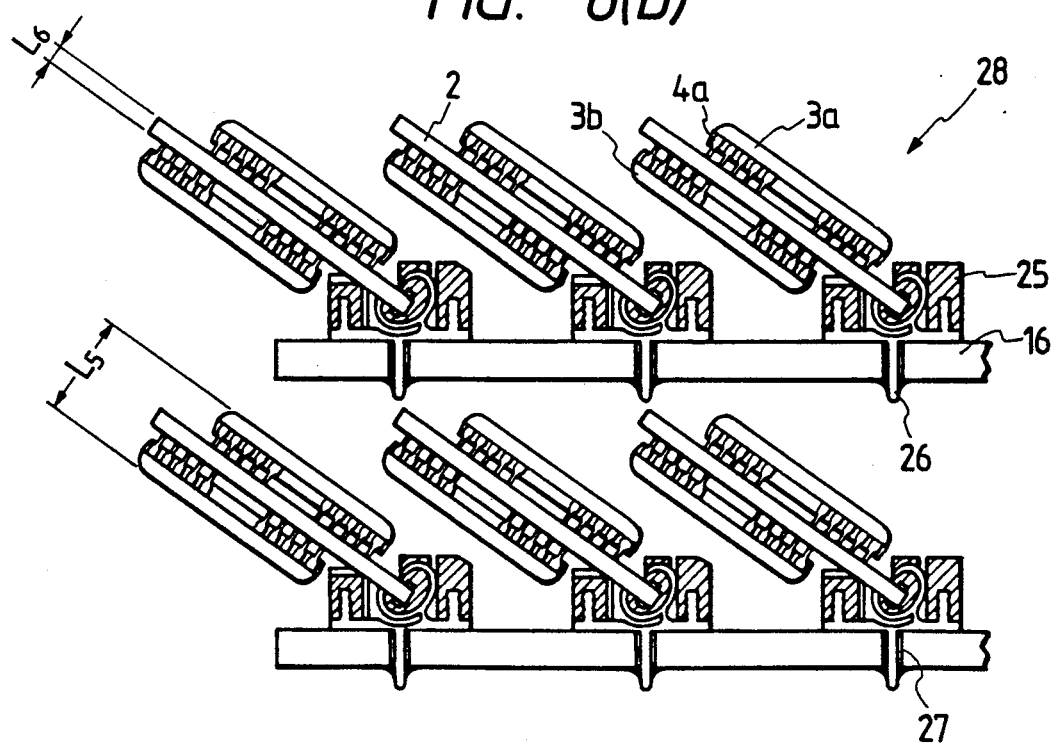
FIG. 8(b) is a sectional view of principal portions when double face packaging modules of the present invention are packaged in multiple stages.

FIG. 8(b) is a sectional view of the module 28 taken along line X—X' of FIG. 7 when the semiconductor device 1 of the present invention is fitted to the socket 25 and a plurality of these sockets 25 are mounted to the mother board 16. This module 28 is incorporated in a large-scale computer or in a large-scale computer system. The socket pin 26 for picking up the signal, which is fitted to the socket 25 having the semiconductor device 1 fitted thereto, is inserted into the through-hole 27 formed on the sub-mother board 16 through a solder or the like for the purpose of mounting. The tip of each socket pin projects outward from the back of the sub-mother board 16, that is, the surface on which the semiconductor device 1 is not mounted. Here, the numeric values are $L_5 = 9.30$ mm and $L_6 = 1.27$ mm, for example.

It can be understood clearly by comparing FIGS. 8(a) and 8(b) that the overall packaging height is reduced in the present invention, as shown by FIG. 8(b), by mounting the upper semiconductor parts 3a closer to the socket 25 when the double-sided package module 28 is slantingly mounted to the sub-mother board 16. It can be understood, too, that the tip of the socket pin 27 projecting from the lower surface of the sub-mother board 16 is effectively prevented from short-circuiting with the lead 4a of the semiconductor parts 3a of the lower stage.

Next, the mounting process of the semiconductor parts 3a, 3b will be explained. A solder cream consisting of a mixture of a solder and a solder flux is formed at foot print portions 8a, 8b by screen printing. Ten or eight each of chip capacitors 18 and semiconductor parts 3a, 3b are mounted on this solder cream on one of the surfaces of the substrate. The leads 4 and the print portions 18 are soldered by subjecting the substrate as a whole under this state to heat-treatment such as reflow.

What is claimed is:

1. A semiconductor device comprising:
   a substantially rectangular shaped double-sided board having a first surface, a second surface and a plurality of external electrodes arranged on each of said first and second surfaces along one of its longer side edge of the board;
   a first set of integrated circuit devices mounted on the first surface along said longer side only in a row and electrically connected to said external electrodes on the first surface;
   a second set of integrated circuit devices mounted on the second surface along said longer side only in a row and electrically connected to said external electrodes on the second surface; and
   a substrate for mounting said double-sided board, said substrate having a connection terminal portion electrically connected with said external electrodes,
   wherein all first set of integrated circuit devices being arranged closer to said longer side edge of the board where said external electrodes are arranged than said second set of integrated circuit devices, and
   wherein said double-sided board is mounted to the substrate at an acute angle with said second surface of said double-sided board facing said substrate.

2. A semiconductor device according to claim 1, further comprising:
   a socket member connected to said substrate and having a mounting portion for electrically connecting said external electrodes of the board to said substrate.

3. A semiconductor device according to claim 1, wherein each integrated circuit device comprises
   an integrated circuit pellet having external terminals formed on one surface thereof;
   leads for external connection;
   thin metallic wires electrically connecting between said external terminals of said pellet and said leads;
   a mold resin member for encapsulating said thin metallic wires and part of said leads.

4. A semiconductor device according to claim 1, wherein said board comprises four resin layers, each of which has a wiring pattern.

5. A semiconductor device according to claim 4, wherein each resin layer comprises a glass-epoxy resin material.

6. A semiconductor module comprising:
   a substantially rectangular shaped double-sided board having a first surface, a second surface, a first side edge which is one of its longer side edges of the board, a second side edge which is opposite to said first side edge, and a plurality of external electrodes arranged on each of said first and second surfaces along said first side edge;
   a first set of integrated circuit devices mounted on said first surface along and adjacent to said second side edge in a row and electrically connected to said external electrodes on the first surface;
   a second set of integrated circuit devices mounted on the second surface along and adjacent to said second side edge in a row and electrically connected to said external electrodes on the second surface; and
   a substrate for mounting said double-sided board, said substrate having a connection terminal portion electrically connected with said external electrodes,
   wherein said second set of integrated circuit devices being arranged closer to said second side edge than said first set of integrated circuit devices, and
   wherein said double-sided board is mounted to said substrate at an acute angle with said second surface of said double-sided board facing said substrate.

7. A semiconductor module according to claim 6, wherein each integrated circuit device comprises:
   an integrated circuit pellet having external terminals formed on one surface thereof;
   leads for external connection;
   thin metallic wires electrically connecting between said external terminals of said pellet and said leads; and
   a mold resin member for encapsulating said thin metallic wires and part of said leads.

8. A semiconductor module according to claim 6, wherein said double-sided board comprises four resin layers, each of which has a wiring pattern.

9. A semiconductor module according to claim 8, wherein each resin layer comprises a glass-epoxy resin material.

* * * * *